(12) United States Patent
Aram

(10) Patent No.: US 7,403,067 B1
(45) Date of Patent: *Jul. 22, 2008

(54) COMPENSATION CIRCUIT FOR AMPLIFIERS HAVING MULTIPLE STAGES

(75) Inventor: Farbod Aram, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 402 days.

This patent is subject to a terminal disclaimer.

(21) Appl. No.: 11/293,556

(22) Filed: Dec. 2, 2005

Related U.S. Application Data

(63) Continuation of application No. 10/776,381, filed on Feb. 11, 2004, now Pat. No. 7,002,409.

(51) Int. Cl.
H03F 1/24 (2006.01)

(52) U.S. Cl. ............................. 330/98; 330/85; 330/99; 330/103; 330/109; 330/260

(58) Field of Classification Search .................. 330/85, 330/98–100, 103, 105, 109, 260, 292
See application file for complete search history.

(56) References Cited

U.S. PATENT DOCUMENTS

| | | | |
|---|---|---|---|
| 3,737,798 A | 6/1973 | Faraguet et al. | |
| 3,988,689 A | 10/1976 | Ochi et al. | |
| 4,502,017 A | 2/1985 | Van de Plassche et al. | |
| 5,117,200 A | 5/1992 | Scott, III | |
| 5,155,447 A | 10/1992 | Huijsing et al. | |
| 5,854,573 A | 12/1998 | Chan | |
| 6,150,884 A | 11/2000 | Fattaruso | |
| 6,208,206 B1 | 3/2001 | Leung et al. | |
| 6,340,918 B2 | 1/2002 | Taylor | |
| 6,466,091 B1 | 10/2002 | Kejariwal et al. | |
| 6,515,540 B1 | 2/2003 | Prasad et al. | |
| 6,525,589 B1 | 2/2003 | Thomsen et al. | |
| 6,573,791 B2 * | 6/2003 | Sridhar | 330/109 |
| 6,731,165 B1 | 5/2004 | Marz | |
| 6,798,285 B2 * | 9/2004 | Candy | 330/109 |
| 7,002,409 B1 * | 2/2006 | Aram | 330/98 |

OTHER PUBLICATIONS

W. Grise, Dept. of IET, Morehead State University, Morehead, KY; Application of the Operational Transconductance Amplifier (OTA) to Voltage-controlled Amplifiers and Active Filters; 10 pages, no date.

Axel Thomsen, Dan Kasha, Wai Lee, Crystal Semiconductor Division, Cirrus Logic, Inc., Austin, Texas; A Five Stage Chopper Stabilized Instrumentation Amplifier Using Feedforward Compensation; 1998; 4 pages, no month & date.

(Continued)

*Primary Examiner*—Khai M Nguyen

(57) ABSTRACT

An amplifier circuit comprises a first capacitance having one end that communicates with an input of a first amplifier stage. An amplifier has a first gain, an input that communicates with an opposite end of the first capacitance, and an output. A second capacitance has a first end that communicates with the output of the amplifier and an opposite end that communicates with an input of a second amplifier stage. A broadband buffer has an input that communicates with the output of the amplifier and an output that communicates with the one end of the second capacitance.

12 Claims, 10 Drawing Sheets

OTHER PUBLICATIONS

Axel Thomsen, Edwin de Angel, Sherry Ziachong Wu, Aryesh Amar, Lei Wang, Wai Lee, WA 20.1 A DC Measurement IC with 130nV$_{pp}$ Noise in 10Hz; 2000 IEEE International Solid-State Circuits Conference; 9 pages, no month/date.

Axel Thomsen, Edwin de Angel, Sherry Ziachong Wu, Aryesh Amar, Lei Wang, Wai Lee, WA 20.1 A DC Measurement IC with 130nV$_{pp}$ Noise in 10Hz; ISSCC 2000/Session 20/Oversampled Converters/ Paper WA 20.1 ISSCC 2000 Slide Supplement; 5 pages, pp. 266-267 and 483-485; no month/ date.

M. Moyal, M. Groepl, H. Werker, G. Mitteregger, J. Schambacher; Xignal Technologies AG, Munich, Germany; 23.6 A 700/900mW/ Channel CMOS Dual Analog Front-End IC for VDSL with Integrated 11.5/14.5dBm Line Drivers; 2003 IEEE International Solid-State Circuits Conference; ISSCC 2003/Session 23/Mixed-Signal and Wireline Techniques; 10 pages, no month/date.

M. Moyal, M. Groepl, H. Werker, G. Mitteregger, J. Schambacher; Xignal Technologies AG, Munich, Germany; A 700/900mW/Channel CMOS Dual Analog Front-End IC for VDSL with Integrated 11.5/14.5dBm Line Drivers; Outline, Overview 24 pages, no month/ date.

\* cited by examiner

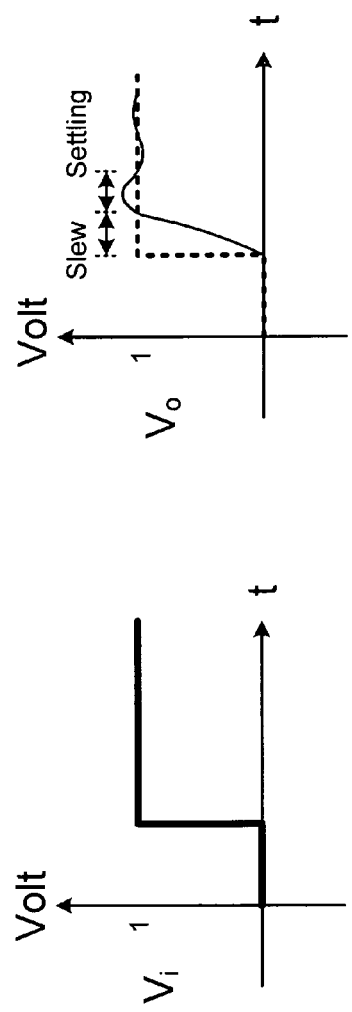
FIG. 5
FIG. 6
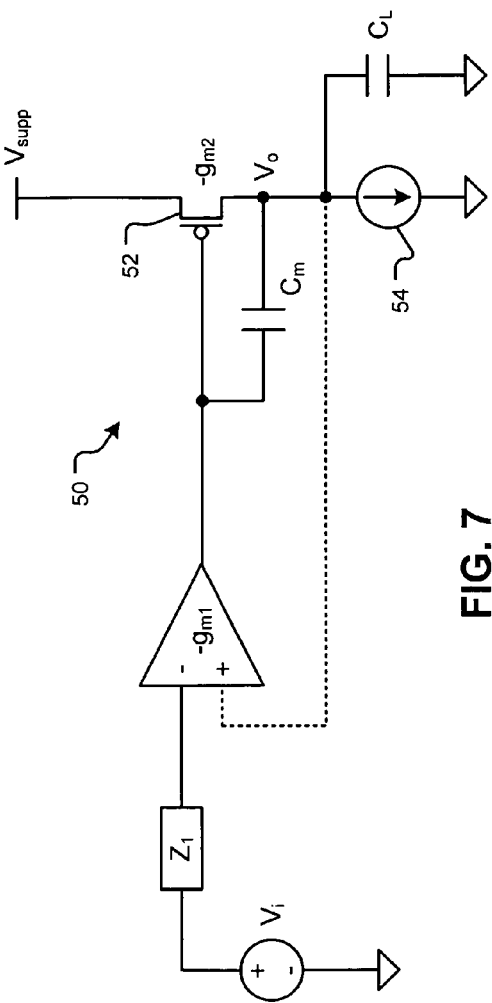
FIG. 7
*Prior Art*

COMPENSATION CIRCUIT FOR AMPLIFIERS HAVING MULTIPLE STAGES

CROSS-REFERENCE TO RELATED APPLICATIONS

This application is a continuation of U.S. patent application Ser. No. 10/776,381 filed on Feb. 11, 2004 now U.S. Pat. No. 7,002,409. The disclosure of the above application is incorporated herein by reference.

FIELD OF THE INVENTION

The present invention relates to amplifiers, and more particularly to compensation circuits for amplifiers having two or more stages.

BACKGROUND OF THE INVENTION

The statements in this section merely provide background information related to the present disclosure and may not constitute prior art.

Referring now to FIG. 1, an amplifier circuit 10 without compensation is shown. A voltage source $V_i$ delivers voltage through an impedance $Z_1$ to an inverting input of an amplifier 16. A non-inverting input of the amplifier 16 is coupled to a reference potential such as ground. The inverting input of the amplifier 16 is coupled through a feedback impedance $Z_2$ to an output of the amplifier 16. A load capacitance $C_L$ is coupled to the output of the amplifier 16. An output voltage $V_o$ is taken at the output of the amplifier 16. The impedances $Z_1$ and $Z_2$ can be resistive, capacitive and/or short circuits.

Because power supply voltage levels have been reduced to decrease the power dissipation of a host device, it has become more difficult to supply voltage to the required transistors when they are arranged in a single amplifier stage. Therefore, the amplifier 16 is sometimes implemented using two or more amplifier stages. When two or more stages are required, compensation is also typically required to increase the gain and/or bandwidth of the amplifier circuit.

Referring now to FIGS. 2A and 2B, a two stage amplifier circuit 18 with Miller compensation is shown. The amplifier 16 includes a first amplifier stage 20 having a first transconductance $g_{m1}$ and a second amplifier stage 22 having a second transconductance $g_{m2}$. The output of the first amplifier stage 20 is connected to an inverting input of the second amplifier stage 22. Compensation is provided by a Miller capacitor $C_m$ having one end that is connected to the input of the second amplifier stage 22. Another end of the Miller capacitor $C_m$ is connected to the output of the second amplifier stage 22.

The most relevant characteristics of an amplifier circuit are gain and bandwidth. The following discussion sets forth the open loop DC gain and the bandwidth of the circuit in FIG. 2B both with and without the Miller capacitance $C_m$. To correctly identify the bandwidth, a parasitic capacitance $C_p$ of the second amplifier stage 22 and internal resistances $R_1$ an $R_2$ of the first and second amplifier stages 20 and 22 are considered as shown in FIG. 2B.

In order to derive the bandwidth, an open loop response technique is used. The open loop response technique provides information relating to the bandwidth and maximum achievable bandwidth of a circuit. The DC gain of the open loop response is determined by opening the feedback loop adjacent to the output of the second amplifier stage and attaching a voltage source to one end of the feedback loop. The output voltage is sensed at the other end of the feedback loop as shown in FIG. 2B.

To derive the bandwidth, the DC gain of the open loop response and the first dominant pole $P_1$ are found. Assuming stable operation, there is only one pole $P_1$ that is located below a crossover frequency. The crossover frequency is the product of the DC gain of the open loop response and the first dominant pole $P_1$. The crossover frequency defines the bandwidth of the closed loop amplifier. The maximum available bandwidth is related to the second non-dominant pole $P_2$.

Referring now to FIG. 3, the response of the amplifier circuit of FIG. 2B without the Miller compensation capacitor $C_m$ is shown. The DC gain of the open loop response is $$\frac{Z_1}{Z_1+Z_2} g_{m1} R_1 g_{m2} R_2$$

and the circuit has a first pole at $$\frac{1}{C_P R_1}$$

and a second pole at $$\frac{1}{C_L R_2}.$$

The first and second poles occur at frequencies that are relatively close together. The dominant pole of the first and second poles will depend upon the values of $C_L$, $C_P$, $R_1$ and $R_2$.

Referring now to FIG. 4, the response of the amplifier circuit of FIG. 2B with the Miller compensation capacitor $C_m$ is shown. The DC gain of the open loop response is the same as the amplifier circuit without the Miller compensation capacitor $C_m$. The circuit has a dominant pole at $$\frac{1}{(C_P+C_m A_2)R_1} = \frac{1}{(C_P+C_m g_{m2} R_2)R_1}.$$

Multiplying the DC gain of the open loop response with $P_1$ results in the crossover frequency of the circuit arrangement of approximately $$\frac{Z_1 g_{m1}}{(Z_1+Z_2)C_m}$$

since $C_p \ll C_m g_{m2} R_2$. Further the circuit arrangement has a non-dominant pole at $$\frac{A_2}{C_L R_2} = \frac{g_{m2} R_2}{C_L R_2} = \frac{g_{m2}}{C_L},$$

which relates to a barrier frequency or maximum achievable bandwidth. The dominant pole has been reduced by approximately $C_m g_{m2} R_2 R_1$. The non-dominant pole has been increased by approximately $$\frac{g_{m2}}{R_2}.$$

As a result, the dominant pole moves to a lower frequency while the non-dominant pole moves to a higher frequency.

While the Miller compensation capacitor $C_m$ increases the bandwidth of the two stage amplifier, additional increases in bandwidth are very difficult to achieve. Increasing the bandwidth involves moving the location of the poles, which are typically in the form of $$\frac{1}{RC}.$$

The value of the parasitic capacitance $C_p$ of the second amplifier stage cannot be reduced. The value of the resistance $R_1$ usually cannot be reduced without adversely impacting the gain of the first amplifier stage since $A_1 = g_{m1} R_1$ and the DC gain of the open loop response.

Other performance criteria of multistage amplifiers include slew time, settling time and voltage rejection in power supply implementations. Referring now to FIGS. 5-7, slew time refers to the amount of time that is required for the output voltage to transition within a predetermined percentage of a final value after a change in the input voltage. The settling time refers to the amount of time that is required after the slew time for the output voltage to settle within a predetermined percentage of the final value. FIG. 6 shows exemplary slew and settling times.

In a power supply circuit 50 that is shown in FIG. 7, one end of a Miller compensation capacitor $C_m$ is connected to an output of the first amplifier stage 20 and an input or gate of the second amplifier stage 22. The second amplifier stage 22 is implemented using a PMOS transistor 52 having drain that is connected to a voltage potential $V_{sup}$. The source of the transistor 52 is connected to an opposite end of the Miller capacitor $C_m$. A current source 54 and the load capacitor $C_L$ are connected to the source of the transistor 52 as well. The transistor 52 may be implemented using other transistor technologies.

In the circuit in FIG. 7, the slew time of the power supply circuit 50 is dependent upon the charging time of the Miller capacitance $C_m$. More particularly, $$slewt = \frac{V_i C_m}{I_i}.$$

The slew time is proportional to the charging time for the Miller capacitance $C_m$, which is not desirable.

At low frequencies, the Miller capacitance $C_m$ is an open circuit and a feedback signal is fed back to the non-inverting input. At high frequencies, $C_m$ shorts and a voltage divider is created between the load impedance $Z_L$ and the transconductance $g_{m2}$. As a result, the output voltage $$V_O = \frac{V_{sup} Z_L}{Z_L + \frac{1}{g_{m2}}}.$$

Therefore, $V_O$ is proportional to $V_{sup}$. The power supply has relatively poor power supply voltage rejection since the fluctuations of the supply voltage $V_{sup}$ are also seen in the output voltage $V_O$.

SUMMARY OF THE INVENTION

A compensation circuit for an amplifier with at least first and second amplifier stages comprises a first capacitance having one end that communicates with an input of the first amplifier stage. An amplifier has a first gain, an input that communicates with an opposite end of the first capacitance, and an output. A second capacitance has a first end that communicates with the output of the broadband amplifier and an opposite end that communicates with an input of the second amplifier stage.

In other features, the amplifier is a broadband amplifier. The broadband amplifier includes a current source and a transimpedance amplifier having an output and an input that communicates with the current source.

In yet other features, the current source includes a first transistor including a control terminal and first and second terminals. A bias resistance has one end that communicates with the control terminal of the first transistor and an opposite end that communicates with the first terminal of the first transistor. A current source communicates with the first terminal.

In still other features, the transimpedance amplifier includes a first transistor having a control terminal and first and second terminals. A feedback resistance has one end that communicates with the control terminal and an opposite end that communicates with the first terminal. A current source communicates with the first terminal.

In yet other features, a buffer has an input that communicates with the output of the amplifier and an output that communicates with the one end of the second capacitance. The buffer includes a first transistor having a control terminal and first and second terminals. A second transistor has a control terminal, a first terminal that communicates with the second terminal of the first transistor, and a second terminal. Third, fourth, and fifth transistors each have a control terminal and first and second terminals. The control terminal of the third transistor communicates with the control terminal of the second transistor. The first terminal of the third transistor communicates with the control terminal of the fourth transistor. The first terminal of the fourth transistor communicates with the control terminal of the fifth transistor. The first terminal of the first transistor communicates with the first terminal of the fifth transistor. A resistance has one end that communicates with the first terminal of the third transistor and an opposite end that communicates with the first terminal of the fourth transistor. A feedback capacitance has one end that communicates with the first terminal of the first transistor and an opposite end that communicates with the control terminals of the second and third transistors.

In other features, an amplifier circuit comprises the compensation circuit and further comprises the first amplifier stage and the second amplifier stage.

In still other features, a load capacitance has one end that communicates with an output of the second amplifier stage. A first impedance has one end that communicates with the input of the first amplifier stage. A second impedance has one end that communicates with the input of the first amplifier stage and an opposite end that communicates with the output of the second amplifier stage. The first and second impedances are at least one of a resistance, a capacitance and a short circuit.

A broadband inverter comprises a first transistor having a control terminal and first and second terminals. A second transistor has a control terminal, a first terminal that communicates with the second terminal of the first transistor, and a second terminal. Third, fourth, and fifth transistors each have a control terminal and first and second terminals. The control terminal of the third transistor communicates with the control terminal of the second transistor. The first terminal of the third transistor communicates with the control terminal of the fourth transistor. The first terminal of the fourth transistor communicates with the control terminal of the fifth transistor. The first terminal of the first transistor communicates with the first terminal of the fifth transistor. A resistance has one end that communicates with the first terminal of the third transistor and an opposite end that communicates with the first terminal of the fourth transistor. A feedback capacitance has one end that communicates with the first terminal of the first transistor and an opposite end that communicates with the control terminals of the second and third transistors.

In other features, the first transistor is a PMOS transistor, the control terminal of the first transistor is a gate, the first terminal of the first transistor is a source and the second terminal of the first transistor is a drain.

In other features, the second, third, fourth and fifth transistors are NMOS transistors, the control terminals of the second, third, fourth and fifth transistors are gates, the first terminals of the second, third, fourth and fifth transistors are sources and the second terminals of the second, third, fourth and fifth transistors are drains.

In still other features, first, second, third, and fourth current sources communicate with the first terminals of the first, third, fourth and fifth transistors.

In still other features, the control terminal of the first transistor receives an input voltage and an output voltage is produced at the first terminal of the fifth transistor.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

The present invention will become more fully understood from the detailed description and the accompanying drawings, wherein:

FIGS. 5 and 6 illustrate an input voltage, an output voltage, slew time and settling time;

FIG. 7 is an electrical schematic of a power supply including a two stage amplifier circuit and a Miller compensation capacitor according to the prior art;

DETAILED DESCRIPTION OF THE PREFERRED EMBODIMENTS

Figure 1:
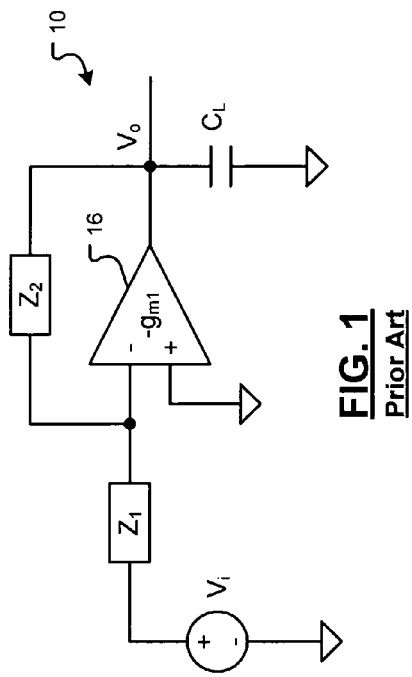
FIG. 1 is an electrical schematic of an amplifier circuit according to the prior art.
Figure 2A:
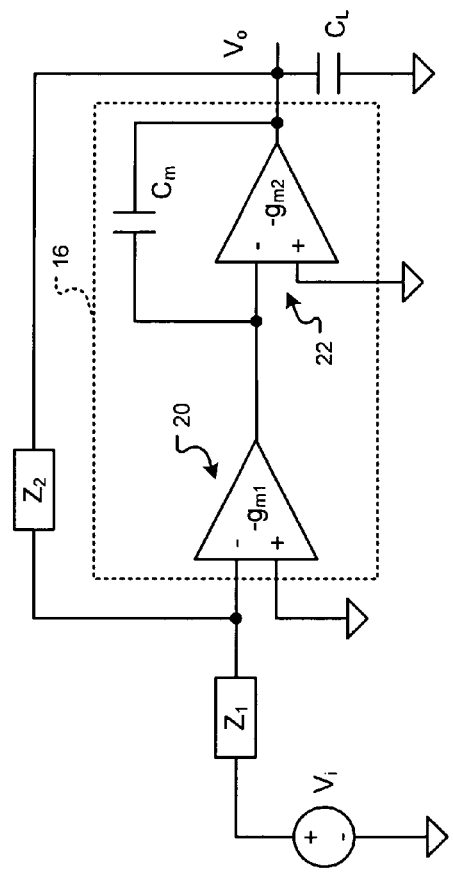
FIG. 2A is an electrical schematic of a two stage amplifier circuit with a Miller compensation capacitor according to the prior art.
Figure 2B:
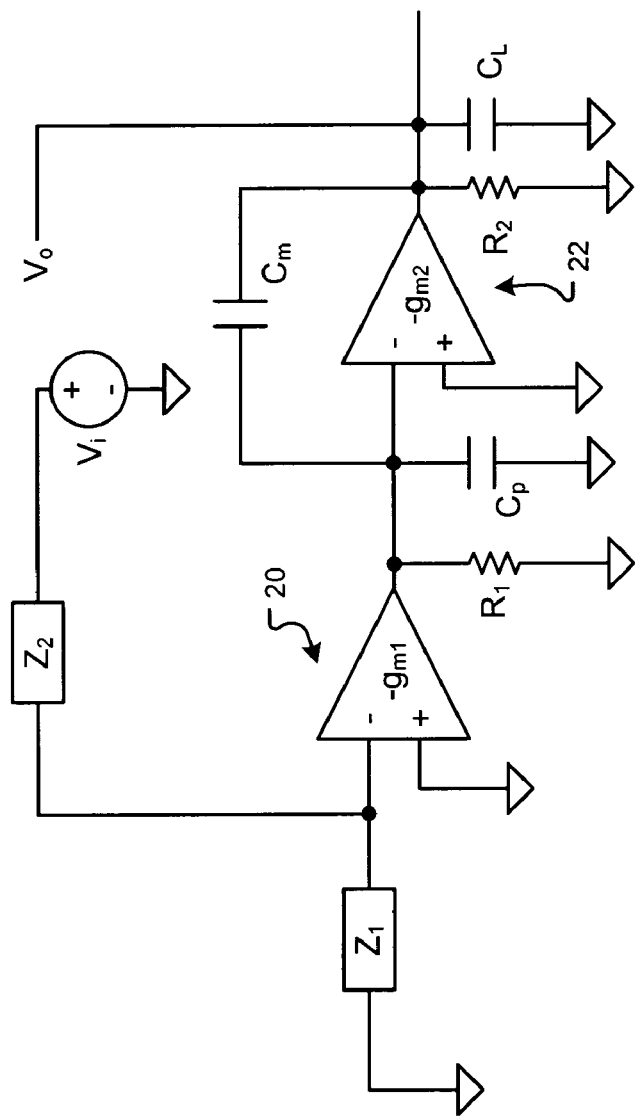
FIG. 2B is an electrical schematic of an open loop response configuration of a two stage amplifier circuit with Miller compensation capacitor, internal resistances and a parasitic capacitance according to the prior art.
Figure 3:
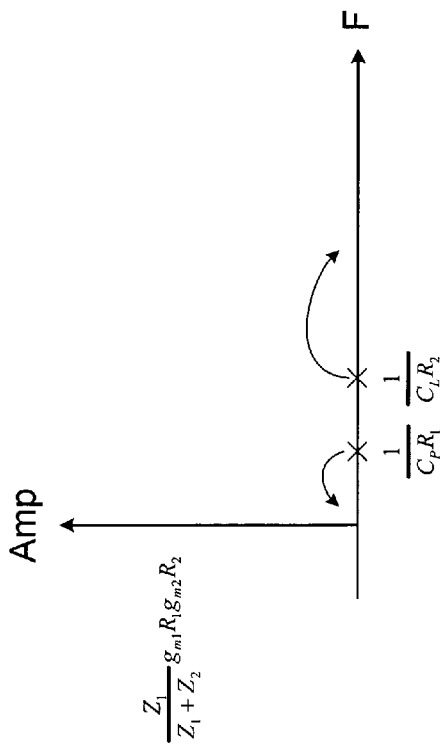
FIG. 3 illustrates the open loop response of the circuit of FIG. 2A without the Miller compensation capacitor.
Figure 4:
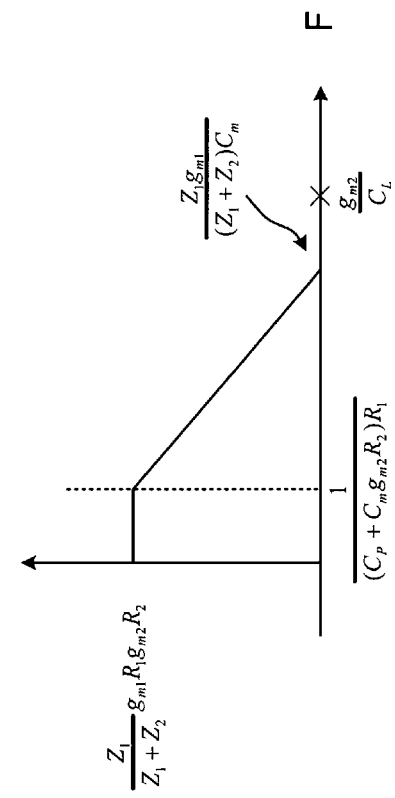
FIG. 4 illustrates the open loop response of the circuit of FIG. 2A with the Miller compensation capacitor.

The following description of the preferred embodiment(s) is merely exemplary in nature and is in no way intended to limit the invention, its application, or uses. For purposes of clarity, the same reference numbers will be used in the drawings to identify similar elements.

Figure 8:
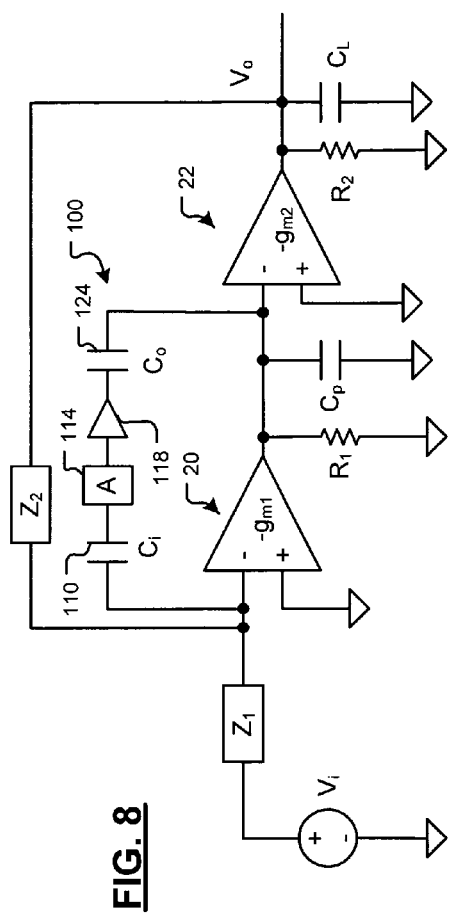
FIG. 8 is an electrical schematic of a two stage amplifier circuit with a compensation circuit according to the present invention.

Referring now to FIG. 8, a compensation circuit according to the present invention is shown for an amplifier circuit that includes two or more stages. The amplifier 16 is shown to include the first amplifier stage 20 having a first transconductance $g_{m1}$ and the second amplifier stage 22 having a second transconductance $g_{m2}$. The internal resistances $R_1$ and $R_2$ and a parasitic capacitance $C_p$ of the second amplifier stage 22 are shown. The load capacitance $C_L$ is connected to the output of the second amplifier stage 22.

The compensation circuit 100 includes an input capacitance $C_i$ 110 having one end that is coupled to the inverting input of the first amplifier stage 20. An opposite end of the input capacitance $C_i$ 110 is connected to an amplifier 114 having a gain A. In one implementation, the amplifier 114 is a broadband amplifier. An output of the amplifier 114 is connected to an input of an optional buffer 118. An output of the buffer 118 is connected to one end of an output capacitance $C_O$ 124. An opposite end of the output capacitance $C_O$ is connected to the output of the first amplifier stage 20. The capacitances $C_i$ and $C_O$ act as a low frequency decoupler and a high frequency connector.

Figure 9:
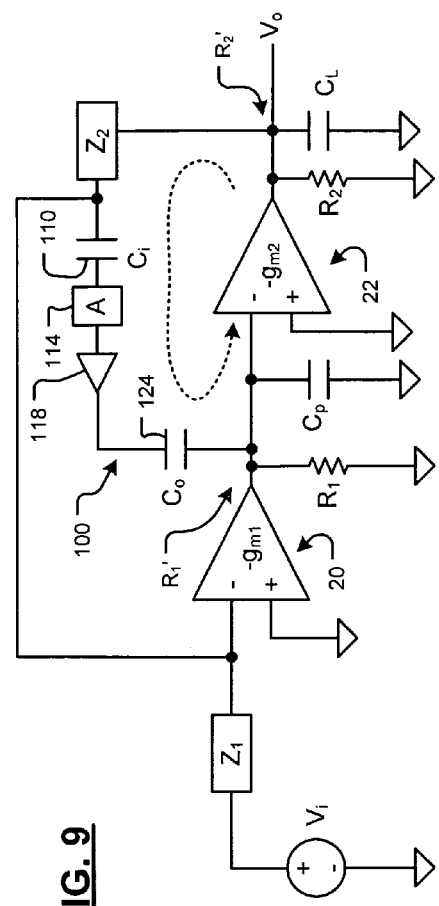
FIG. 9 is the electrical schematic of FIG. 8 redrawn to illustrate the feedback loop provided by the compensation circuit.

Referring now to FIGS. 8 and 9, at low frequency, the capacitances $C_i$ and $C_O$ (110 and 124) are open circuits and the compensation circuit 100 does not provide feedback.

Therefore, the compensation circuit 100 does not impact the resistance $R_1$ at low frequencies, which allows the amplifier to maintain a relatively high open loop DC gain. At mid to higher frequencies, the compensation circuit 100 begins providing feedback from the output of the second amplifier 22 through the impedance $Z_2$ and the compensation circuit 100 to the input of the second amplifier stage 22. This feedback loop can be seen more readily in FIG. 9.

Figure 10:
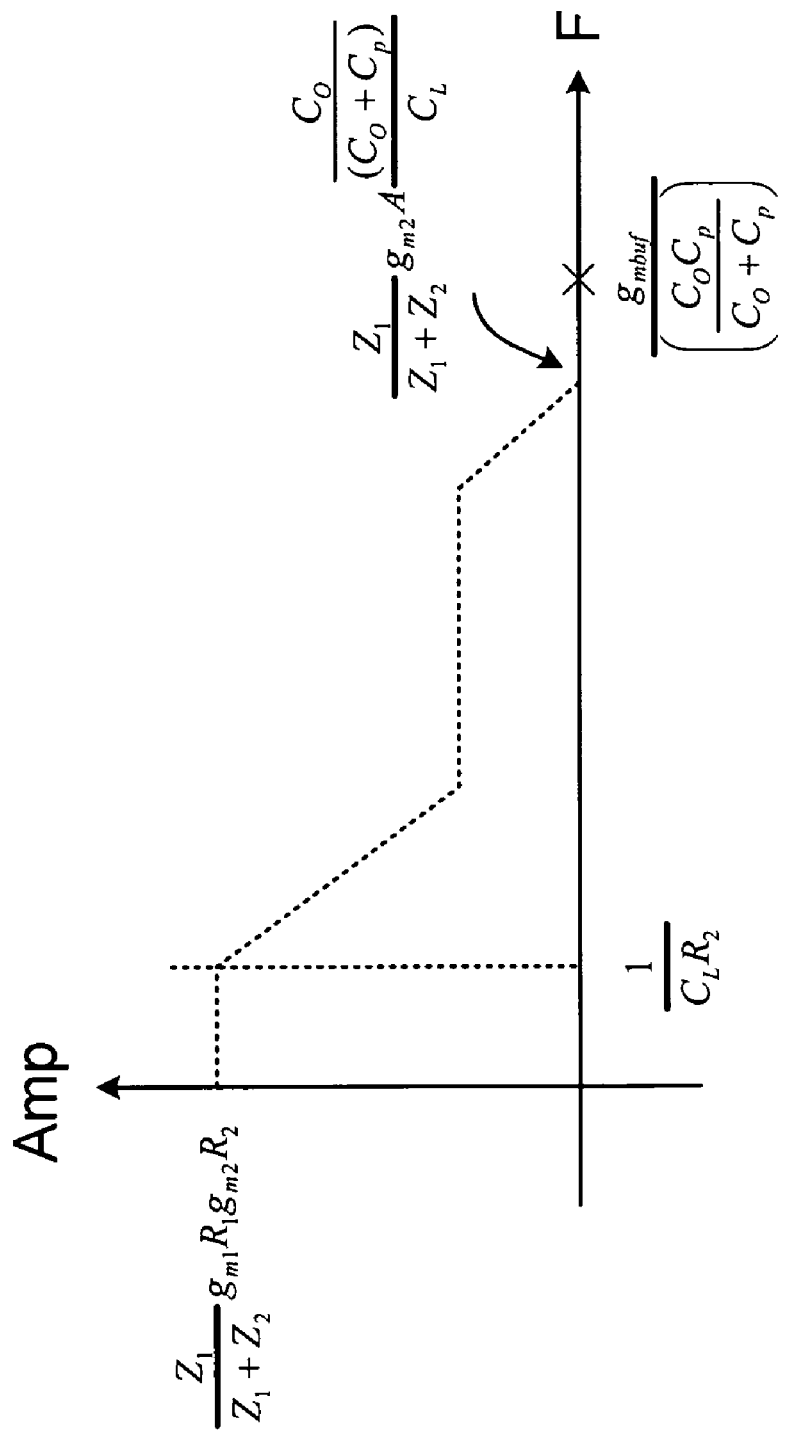
FIG. 10 illustrates the open loop response of the circuits shown in FIGS. 8 and 9.

Referring now to FIG. 10, to derive the bandwidth of the circuit in FIG. 8, the open loop response technique is used as previously described. The DC gain of the open loop response is $$\frac{Z_1}{Z_1+Z_2} g_{m1} R_1 g_{m2} R_2.$$

The amplifier circuit has a dominant pole at $$\frac{1}{C_L R_2}.$$

The crossover frequency of the amplifier circuit of $$\frac{Z_1}{Z_1+Z_2} g_{m2} A \frac{\frac{C_O}{(C_O+C_p)}}{C_L}.$$

Further the amplifier circuit has a non-dominant pole at $$\frac{g_{mbuf}}{\left(\frac{C_O C_p}{C_O+C_p}\right)},$$

which relates to a barrier frequency or maximum achievable bandwidth. When the compensation circuit 100 is active at mid to higher frequencies, the resistance $R_1$ decreases and is equal to $$R_1' = \frac{C_L}{g_{m2} A (C_O+C_p)}.$$

Likewise, the resistance $R_2$ decreases and is equal to $$R_2' = \frac{C_O}{g_{m2} A (C_O+C_p)}.$$

The bandwidth of the amplifier has two distinct sections. The first section is dominated by the first amplifier stage 20. As the non-dominant pole of the first stage becomes problematic, the compensation circuit 100 provides feedback, which increases the bandwidth of the amplifier circuit.

As can be appreciated, the DC gain of the amplifier is the same as the amplifier with the Miller compensation capacitor. The bandwidth of the amplifier circuit is higher by at least the gain of the amplifier 114. The bandwidth of the amplifier circuit is dependent on the transconductance of the second stage and the output capacitance $C_L$.

Figure 11:
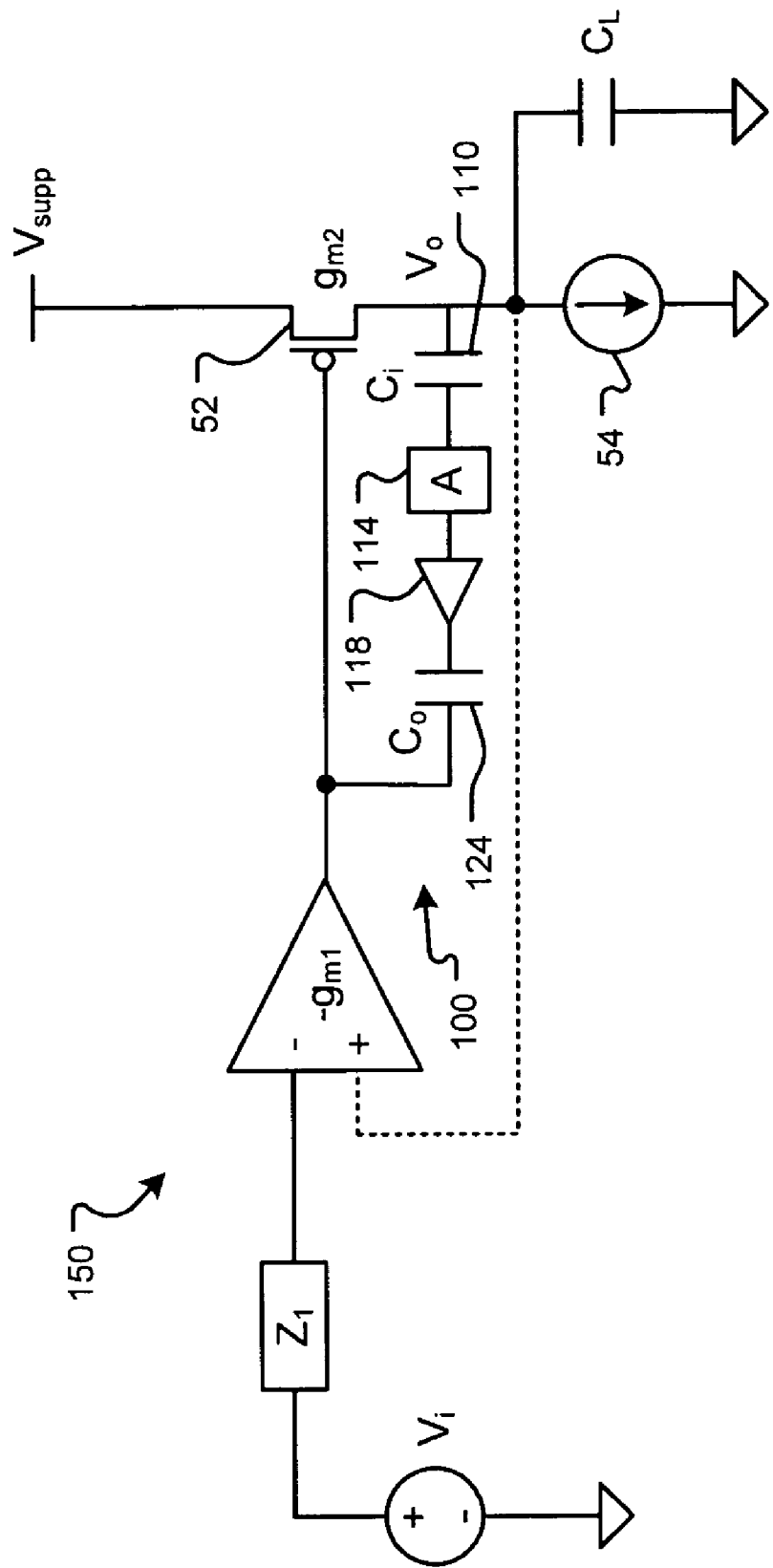
FIG. 11 is an electrical schematic of a power supply including a two stage amplifier circuit and a compensation circuit according to the present invention.

Referring now to FIG. 11, a power supply circuit 150 includes the compensation circuit 100. The slew time is no longer dependent upon the charging time of the Miller compensation capacitor. The slew time is dependent upon the charging time of the effective capacitance of $C_p$ combined with $C_o$, which is much shorter than the charging time for the Miller compensation capacitor $C_m$. In addition, the power supply circuit 10 exhibits improved voltage rejection since $$V_o = \frac{V_{sup}}{A}.$$

Therefore, the voltage rejection of the power supply circuit 150 is improved by a factor of the gain A.

The broadband amplifier 114 preferably has high gain and high bandwidth. The broadband amplifier 114 can be implemented using a wide variety of circuits, some of which are illustrated in FIGS. 12A-12D. Referring now to FIG. 12A, the broadband amplifier 114-1 is shown to include a current source 160-1 and a transimpedance amplifier 164-1. As can be seen in FIG. 12B, a transimpedance amplifier 164-2 of a broadband amplifier 114-2 can be implemented using an operational amplifier (opamp) 166 and a feedback resistance $R_f$, which is connected to the input and output of the opamp 166.

Figure 12C:
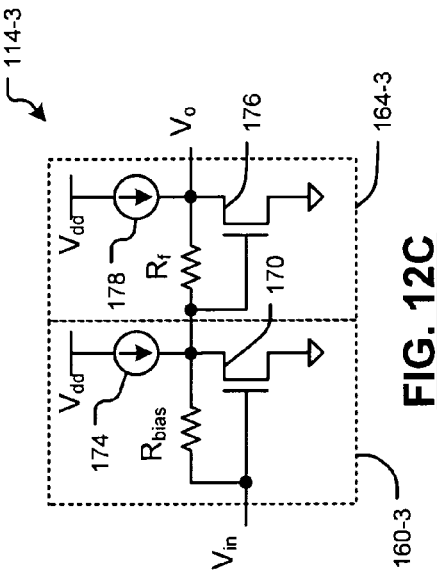
FIGS. 12A-12D illustrate various implementations of the broadband amplifier of FIG. 8.

Referring now to FIG. 12C, an alternate and presently preferred implementation of the broadband amplifier 114-3 is shown to include a current source 160-3 and a transimpedance amplifier 164-3. The current source 164-3 includes a transistor 170 having a gate, a source and a drain. A bias resistance $R_{bias}$ is connected between the gate and the drain of the transistor 170. The drain of the transistor 170 is biased by a current source 174, which is referenced to a supply voltage $V_{dd}$.

The transimpedance amplifier 164-3 includes a transistor 176 having a gate coupled to the drain of the transistor 170. A feedback resistance $R_f$ has one end that is connected to the drain of the transistor 170 and an opposite end that is connected to the drain of the transistor 176. The drain of the transistor 176 is biased by a current source 178, which is referenced to a supply voltage $V_{dd}$. In one implementation, the transistors 170 and 176 are NMOS transistors, although other transistor types may be used.

Figure 12D:
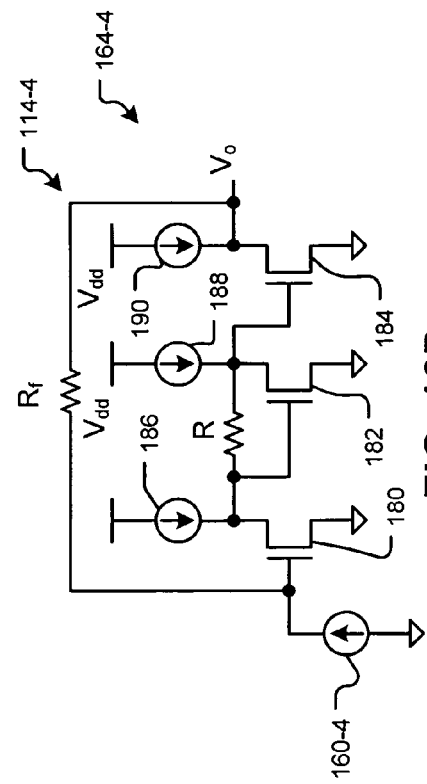
Figure 12A:
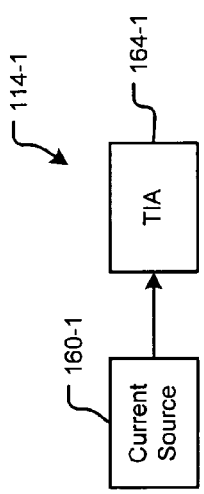
Figure 12B:
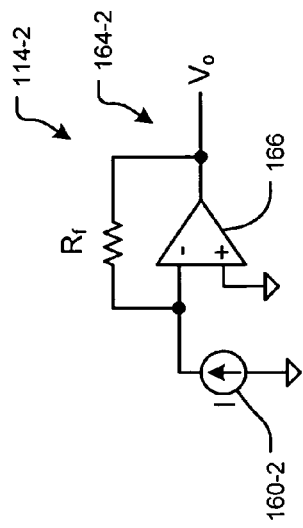

Referring now to FIG. 12D, a broadband amplifier 114-4 is shown to include a current source 160-4 and a transimpedance amplifier 164-4. The transimpedance amplifier 164-4 includes first, second and third transistors 180, 182 and 184. The current source 160-4 biases a gate of the first transistor 180. The drain of the transistor 180 is connected to a gate of the transistor 182 and to one end of a resistance R, which has an opposite end that is connected to a drain of the transistor 182. The drain of the transistor 182 is connected to a gate of the transistor 184. The output voltage $V_o$ is referenced from the drain of the transistor 184. The drains of the transistors 180, 182 and 184 are biased by current sources 186, 188, and 190, respectively, which are referenced to a supply voltage $V_{dd}$. A feedback resistance $R_f$ has one end that is connected to the gate of the transistor 180 and an opposite end that is connected to the drain of the transistor 184. As can be appreciated by skilled artisans, there are still other ways of implementing the broadband amplifier 114 that are well within the scope of the present invention.

Figure 13:
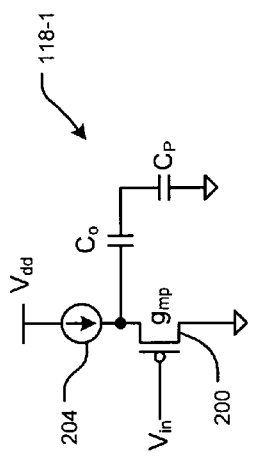
FIG. 13 illustrates a first implementation of the broadband buffer of FIG. 8.

Referring now to FIG. 13, the broadband inverter 118 preferably has a unitary gain and a relatively high bandwidth. One exemplary broadband inverter 118-1 is shown to include a transistor 200 having a gate that is coupled to a voltage input $V_{in}$. A source of the transistor 200 is biased by a current source 204, which is referenced to a supply voltage $V_{dd}$. The source is also coupled to the capacitances $C_o$ and $C_p$ as shown. The transistor 200 can be a PMOS transistor, although other transistor types may be used.

Figure 14:
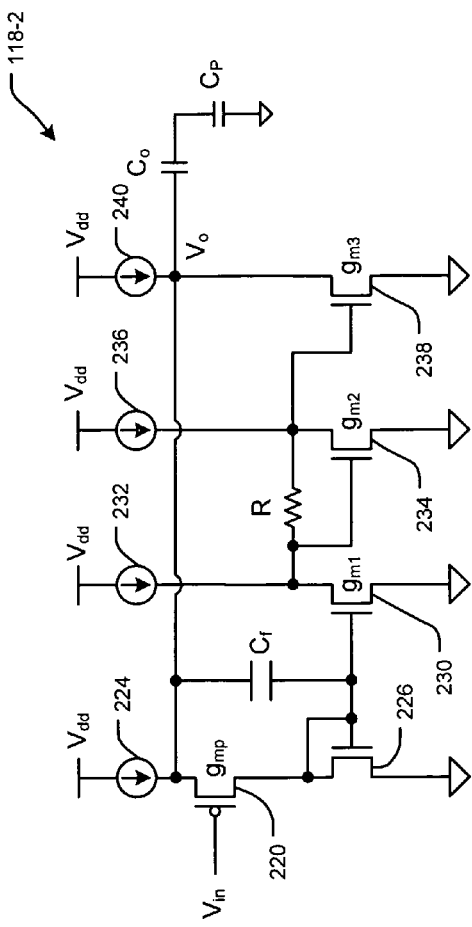
FIG. 14 illustrates a second implementation of the broadband buffer according to the present invention.

Referring now to FIG. 14, while the broadband inverter 118-1 in FIG. 13 has satisfactory bandwidth, the presently preferred broadband inverter 118-2 in FIG. 14 has increased bandwidth. The broadband inverter 118-2 includes a first transistor 220 having a gate that receives an input voltage $V_{in}$. The source of the transistor 220 is coupled to a current source 224, which is referenced to a voltage supply $V_{dd}$. In one embodiment, the transistor 220 is a PMOS transistor, although other transistor types may be used. A drain of the transistor 220 is connected to a drain and a gate of a transistor 226 and a gate of a transistor 230, which has a transconductance $g_{m1}$.

A drain of the transistor 230 is biased by a current source 232, which is referenced to a supply voltage $V_{dd}$. The drain of the transistor 230 is also connected to a gate of a transistor 234 (which has a transimpedance $g_{m2}$) and one end of a resistance R. An opposite end of the resistance R is connected to a drain of the transistor 234. The drain of the transistor 234 is biased by a current source 236, which is referenced to a supply voltage $V_{dd}$. The drain of the transistor 234 is also connected to the gate of a transistor 238, which has a transconductance $g_{m3}$. The drain of the transistor 238 is biased by a current source 240, which is referenced to a supply voltage $V_{dd}$. The drain of the transistor 238 is connected to the source of the transistor 220 and to capacitances $C_o$ and $C_p$. A feedback capacitance $C_f$ is connected between the source of the transistor 220 and the gates of the transistors 226 and 230.

Figure 15:
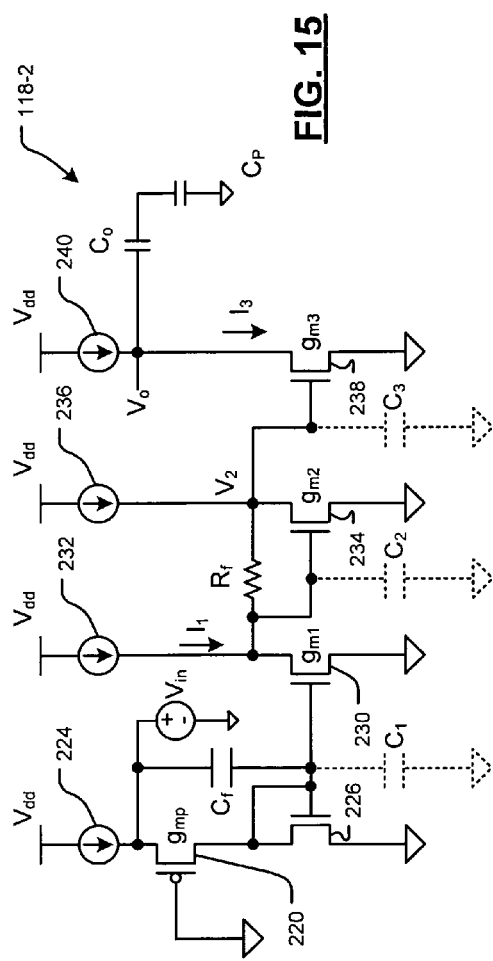
FIG. 15 illustrates the broadband buffer circuit of FIG. 14 in an open loop response configuration.
Figure 16:
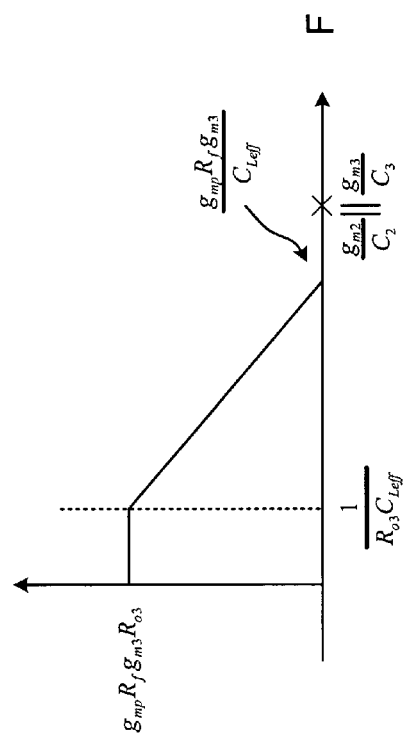
FIG. 16 illustrates the open loop response of the broadband buffer circuit in FIG. 15.

Referring now to FIGS. 15 and 16, the bandwidth of the broadband inverter 118-2 can be found using the open loop response technique that was described above. In FIG. 15, the feedback loop is opened and a voltage source $V_{in}$ is connected to one end of the opened feedback loop. The output voltage $V_o$ is taken at the other end of the opened feedback loop. Parasitic capacitances $C_1$, $C_2$ and $C_3$ are shown and are located at the gates of the transistors 230, 234, and 238.

The input voltage $V_{in}$ generates a current $I_1 = V_{in}g_{mp}$. $I_1$ is mirrored and generates a voltage $V_2 = V_{in}g_{mp}R_f$. A current $I_3$ is produced that is equal to $V_2 g_{m3}$. The output voltage $V_o$ is equal to $I_3 R_{o3}$, where $R_{o3}$ is the output resistance of the transistor 238. Substituting for $I_3$ and then for $V_2$ in the equation for $V_o$ and dividing by $V_{in}$ yields the DC gain for the open loop response of $g_{mp}R_f g_{m3}R_{o3}$. A dominant pole is located at $$\frac{1}{R_{o3}C_{Leff}},$$

where $C_{Leff}$ is equal to a series connection of $C_o$ and $C_p$. Therefore, multiplying the DC gain of the open loop response and the dominant pole yields a crossover frequency at $$\frac{g_{mp}R_f g_{m3}}{C_{Leff}}.$$

Without the feedback capacitance $C_f$, this circuit would have non-dominant poles at $$\frac{g_{mp}}{C_{gmp}}$$

(where $C_{gmp}$ is the parasitic capacitance of the transistor 220), $$\frac{g_{m1}}{C_1}, \frac{g_{m2}}{C_2}, \text{ and } \frac{g_{m3}}{C_3}.$$

Since these non-dominant poles occur at approximately the same frequency F, the parallel combination of these four poles creates a non-dominant pole at $$\frac{F}{4}.$$

These non-dominant poles create a barrier frequency that is relatively low.

By connecting the capacitance $C_f$ as shown in FIGS. 14 and 15, the effect of two of the poles $$\frac{g_{mp}}{C_{gmp}} \text{ and } \frac{g_{m1}}{C_1}$$

is eliminated and the frequency of the non-dominant poles increases to $$\frac{F}{2},$$

which is a higher barrier frequency. As can be appreciated by skilled artisans, there are still other ways of implementing the broadband inverter 118 that are well within the scope of the present invention.

Those skilled in the art can now appreciate from the foregoing description that the broad teachings of the present invention can be implemented in a variety of forms. While a non-differential architecture is shown, skilled artisans will appreciate that the present invention applies to differential circuits as well. Therefore, while this invention has been described in connection with particular examples thereof, the true scope of the invention should not be so limited since other modifications will become apparent to the skilled practitioner upon a study of the drawings, the specification and the following claims.

What is claimed is:

1. An amplifier circuit comprising:
   a first capacitance having one end that communicates with an input of a first amplifier stage;
   an amplifier having a first gain, an input that communicates with an opposite end of said first capacitance, and an output; and a second capacitance having a first end that communicates with said output of said amplifier and an opposite end that communicates with an input of a second amplifier stage; and a first impedance having one end that communicates with the input of the first amplifier stage and an opposite end that communicates with an output of the second amplifier stage.

2. The amplifier circuit of claim 1 wherein said first impedance includes at least one of a resistance, a capacitance and a short circuit.

3. An amplifier circuit comprising:
a first capacitance having one end that communicates with an input of a first amplifier stage;
an amplifier having a first gain, an input that communicates with an opposite end of said first capacitance, and an output and that includes:
  a current source; and
  a transimpedance amplifier having an output and an input that communicates with said current source; and
a second capacitance having a first end that communicates with said output of said amplifier and an opposite end that communicates with an input of a second amplifier stage,
wherein said current source includes:
  a first transistor including a control terminal and first and second terminals;
  a bias resistance having one end that communicates with said control terminal of said first transistor and an opposite end that communicates with said first terminal of said first transistor; and
  a current source that communicates with said first terminal.

4. An amplifier circuit comprising:
a first capacitance having one end that communicates with an input of a first amplifier stage;
an amplifier having a first gain, an input that communicates with an opposite end of said first capacitance, and an output and that includes:
  a current source; and
  a transimpedance amplifier having an output and an input that communicates with said current source; and
a second capacitance having a first end that communicates with said output of said amplifier and an opposite end that communicates with an input of a second amplifier stage,
wherein said transimpedance amplifier includes:
  a first transistor having a control terminal and first and second terminals;
  a feedback resistance having one end that communicates with said control terminal and an opposite end that communicates with said first terminal; and
  a current source that communicates with said first terminal.

5. An amplifier circuit comprising:
a first capacitance having one end that communicates with an input of a first amplifier stage;
an amplifier having a first gain, an input that communicates with an opposite end of said first capacitance, and an output;
a second capacitance having a first end that communicates with said output of said amplifier and an opposite end that communicates with an input of a second amplifier stage; and
a broadband buffer having an input that communicates with said output of said amplifier and an output that communicates with said one end of said second capacitance.

6. The amplifier circuit of claim 5 wherein said amplifier includes a broadband amplifier.

7. The amplifier circuit of claim 6 wherein said broadband amplifier includes:
a current source; and
a transimpedance amplifier having an output and an input that communicates with said current source.

8. The amplifier circuit of claim 5 wherein said broadband buffer includes:
a first transistor having a control terminal and first and second terminals;
a second transistor having a control terminal, a first terminal that communicates with said second terminal of said first transistor, and a second terminal;
third, fourth, and fifth transistors each having a control terminal and first and second terminals, wherein said control terminal of said third transistor communicates with said control terminal of said second transistor, said first terminal of said third transistor communicates with said control terminal of said fourth transistor, said first terminal of said fourth transistor communicates with said control terminal of said fifth transistor, and said first terminal of said first transistor communicates with said first terminal of said fifth transistor;
a resistance having one end that communicates with said first terminal of said third transistor and an opposite end that communicates with said first terminal of said fourth transistor; and
a feedback capacitance having one end that communicates with said first terminal of said first transistor and an opposite end that communicates with said control terminals of said second and third transistors.

9. The amplifier circuit of claim 5 further comprising:
said first amplifier stage; and
said second amplifier stage.

10. The amplifier circuit of claim 9 further comprising a load capacitance having one end that communicates with an output of said second amplifier stage.

11. The amplifier circuit of claim 9 further comprising:
a second impedance that has one end that communicates with said input of said first amplifier stage.

12. The amplifier circuit of claim 11 wherein said second impedance includes at least one of a resistance, a capacitance and a short circuit.

* * * * *